(12) United States Patent
Chang et al.

(10) Patent No.: US 11,121,285 B2
(45) Date of Patent: Sep. 14, 2021

(54) SEMICONDUCTOR DEVICE

(71) Applicant: EPISTAR CORPORATION, Hsinchu (TW)

(72) Inventors: Yung-Fu Chang, Hsinchu (TW); Hui-Fang Kao, Hsinchu (TW); Yi-Tang Lai, Hsinchu (TW); Shih-Chang Lee, Hsinchu (TW); Wen-Luh Liao, Hsinchu (TW); Mei Chun Liu, Hsinchu (TW); Yao-Ru Chang, Hsinchu (TW); Yi Hisao, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 29 days.

(21) Appl. No.: 16/680,207

(22) Filed: Nov. 11, 2019

(65) Prior Publication Data

US 2020/0152831 A1    May 14, 2020

Related U.S. Application Data

(60) Provisional application No. 62/759,973, filed on Nov. 12, 2018.

(51) Int. Cl.
  *H01L 33/14* (2010.01)
  *H01L 33/40* (2010.01)
  *H01L 25/075* (2006.01)

(52) U.S. Cl.
  CPC .......... *H01L 33/14* (2013.01); *H01L 25/0753* (2013.01); *H01L 33/405* (2013.01)

(58) Field of Classification Search
  None
  See application file for complete search history.

(56) References Cited

U.S. PATENT DOCUMENTS

| | | | |
|---|---|---|---|
| 6,091,083 A * | 7/2000 | Hata | H01L 33/007 257/190 |
| 7,560,738 B2 | 7/2009 | Liu | |
| 7,615,796 B2 | 11/2009 | Lu et al. | |
| 8,592,847 B2 | 11/2013 | Chen et al. | |
| 9,887,321 B2 | 2/2018 | Chen et al. | |
| 9,997,687 B2 | 6/2018 | Chen et al. | |
| 2009/0236729 A1 * | 9/2009 | Fann | C22C 12/00 257/692 |
| 2015/0123512 A1 * | 5/2015 | Kannan | H02K 15/00 310/273 |
| 2016/0240732 A1 * | 8/2016 | Huang | H01L 33/62 |
| 2018/0006432 A1 * | 1/2018 | Kondo | H01S 5/042 |
| 2018/0331256 A1 | 11/2018 | Hsu et al. | |

* cited by examiner

*Primary Examiner* — Hsien Ming Lee
(74) *Attorney, Agent, or Firm* — Ditthavong, Steiner & Mlotkowski

(57) ABSTRACT

A semiconductor device includes a conductive layer, a semiconductor stack, a first contact structure, an intermediate structure, a second contact structure, a first electrode and a second electrode. The semiconductor stack is disposed on the conductive layer. The first contact structure is disposed on the semiconductor stack. The intermediate structure encloses the first contact structure. The second contact structure is between the conductive layer and the semiconductor stack. The first electrode is on the conductive layer and separated from the semiconductor stack. The second electrode is on the intermediate structure.

20 Claims, 9 Drawing Sheets

SEMICONDUCTOR DEVICE

CROSS REFERENCE TO RELATED APPLICATIONS

This application claims the right of priority based on U.S. provisional patent application Ser. No. 62/759,973, filed on Nov. 12, 2018, which is incorporated by reference herein in its entirety.

TECHNICAL FIELD

The application relates to a structure of a semiconductor device, and more particularly, to a semiconductor device including a contact structure.

DESCRIPTION OF BACKGROUND ART

Semiconductor device includes semiconductor compounds such as gallium phosphide (GaP), gallium arsenide (GaAs), gallium nitride (GaN) or zinc oxide (ZnO). The semiconductor device can be optoelectronic semiconductor device such as light-emitting device (LED), laser, photodetector, or solar cell, or can be power device such as switch or rectifier. The LED includes a p-type semiconductor structure, an n-type semiconductor structure and an active structure between the p-type semiconductor structure and the n-type semiconductor structure for emitting light under the principle of transforming electrical energy to optical energy by the combination of electrons and holes injected to the active structure by the n-type semiconductor structure and the p-type semiconductor structure respectively.

SUMMARY OF THE APPLICATION

A semiconductor device includes a conductive layer, a semiconductor stack, a first contact structure, an intermediate structure, a second contact structure, a first electrode and a second electrode. The semiconductor stack is disposed on the semiconductor stack. The first contact structure is disposed on the semiconductor stack. The intermediate structure encloses the first contact structure. The second contact structure is between the conductive layer and the semiconductor stack. The first electrode is on the semiconductor stack and separated from the semiconductor stack. The second electrode is on the intermediate structure.

DETAILED DESCRIPTION OF PREFERRED EMBODIMENTS

Figure 1:
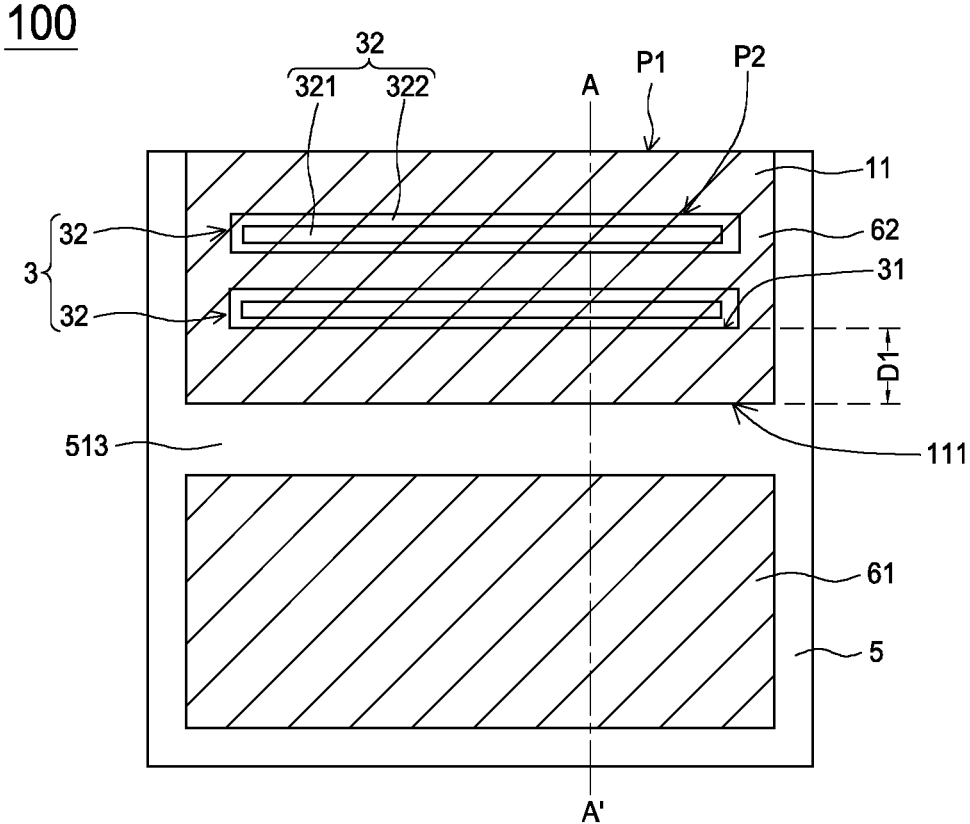
FIG. 1 shows a top view of a semiconductor device in accordance with one embodiment of the present application.

The embodiments of the application are described in detail with reference to the accompanying drawings hereafter. The drawings are not precise scale and components may be exaggerated in view of width, height, length, etc. Herein, the similar or identical reference numerals will denote the similar or identical components throughout the drawings.

Some embodiments are described below to make the person having ordinary skill in the art understand the present disclosure more easily. However, the embodiments are just for exemplification and not for limiting the scope of the present invention. It can be understood that the person having ordinary skill in the art can modify the following embodiments according to his requirement, for example, changing the order of processes and/or including more steps or less steps than the description.

Moreover, other layer/structure or steps can be incorporated in the following embodiments. For example, the description of "forming a second layer/structure on the first layer/structure" can include the embodiment that the first layer/structure directly contacts the second layer/structure or include the embodiment that the first layer/structure indirectly contacts the second layer/structure, that is, other layer/structure exists between the first layer/structure and the second layer/structure. Besides, the spatial relative relationship between the first layer/structure and the second layer/structure may change according to the operation or usage of the device. On the other hand, different embodiments in the present disclosure may have repeated numbers and/or letters. The repetition is for simplification and clear and not for representing the relationship between different embodiments.

Figure 2:
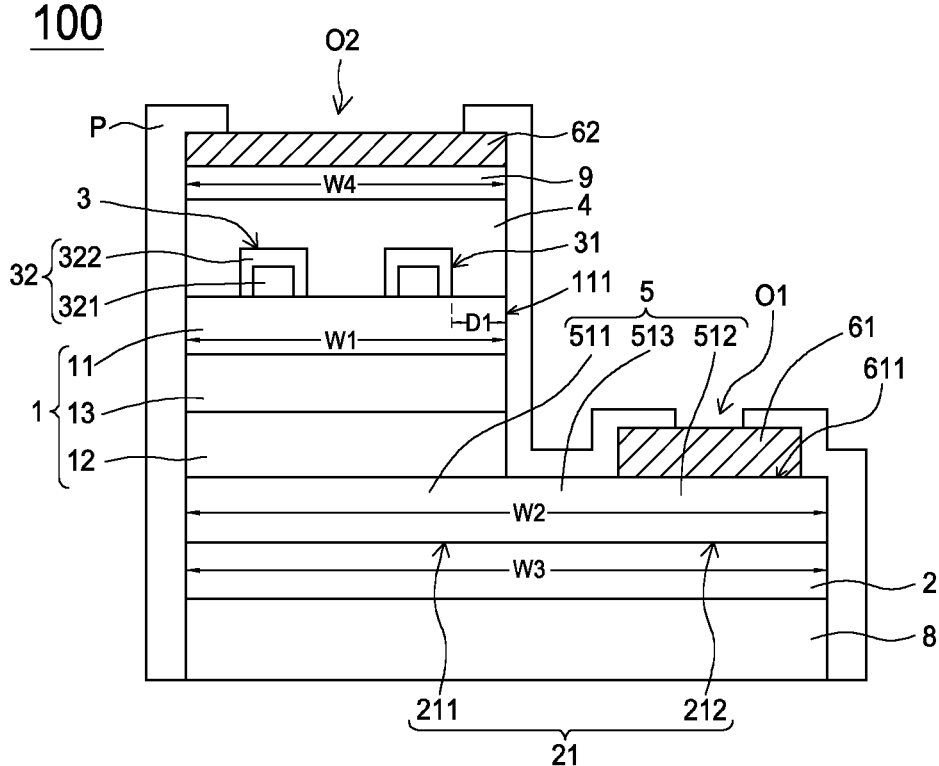
FIG. 2 shows a cross-sectional view of the semiconductor device shown in FIG. 1.

FIG. 1 shows a top view of a semiconductor device 100 in accordance with one embodiment of the present application. FIG. 2 is a cross-sectional view taken along line AA' of FIG. 1. FIG. 1 only shows some layers and each layer is drawn in solid line regardless of its material being non-transparent, transparent, or semi-transparent.

As shown in FIGS. 1 and 2, the semiconductor device 100 includes a semiconductor stack 1, a conductive layer 2, a first contact structure 3 on the semiconductor stack 1, an intermediate layer 4 enclosing the first contact structure 3, a second contact structure 5 between the conductive layer 2 and the semiconductor stack 1, a first electrode 61, and a second electrode 62.

More specifically, the semiconductor stack 1 includes a first semiconductor structure 11, a second semiconductor structure 12, and an active structure 13 located between the first semiconductor structure 11 and the second semiconductor structure 12. The first semiconductor structure 11, the second semiconductor structure 12, and the active structure can be a single layer or a multilayer. The first semiconductor structure 11 and the second semiconductor structure 12 have a first conductive type and a second conductive type different from the first conductive type in order to provide electrons and holes, or holes and electrons, respectively. The active structure 13 can include multiple quantum wells, or the semiconductor stack 1 can be single heterostructure or double heterostructure. The materials of the first semiconductor structure 11, the second semiconductor structure 12, and the active structure 13 include III-V group semiconductor compounds, such as GaAs, InGaAs, AlGaAs, AlGaInAs, GaP, InGaP, AlInP, AlGaInP, GaN, InGaN, AlGaN, AlInGaN, AlAsSb, InGaAsP, InGaAsN, or AlGaAsP. In the embodiments of the present disclosure, if not described otherwise, the above-mentioned chemical formulas include "stoichiometric compounds" and "non-stoichiometric compounds". A "stoichiometric compound" is, for example, a compound in which the total number of atoms of III-group elements is the same as the total number of atoms of V-group elements. On the contrary, a "non-stoichiometric compound" is, for example, a compound in which the total number of atoms of III-group elements is different from the total number of atoms of V-group elements. For example, a compound has a chemical formula of AlGaAs represents that the compound includes Al and/or Ga as III-group elements, and As as V-group element, wherein the total number of atoms of the III-group elements (Al and/or Ga) and the total number of atoms of the V-group elements (As) may be the same or different.

In addition, if the above-mentioned compounds represented by the chemical formulas are stoichiometric compounds, then AlGaAs represents for $Al_{x1}Ga_{(1-x1)}As$, wherein $0<x1<1$; AlInP represents for $Al_{x2}In_{(1-x2)}P$, wherein $0<x2<1$; AlGaInP represents for $(Al_{y1}Ga_{(1-y1)})_{1-x3}In_{x3}P$, wherein $0<x3<1$ and $0<y1<1$; AlGaInAs represents for $(Al_{y2}Ga_{(1-y2)})_{1-x4}In_{x4}As$, wherein $0<x4<1$ and $0<y2<1$; AlGaN represents for $Al_{x5}Ga_{(1-x5)}N$, wherein $0<x5<1$; AlAsSb represents for $AlAs_{x6}Sb_{(1-x6)}$, wherein $0<x6<1$; InGaP represents for $In_{x7}Ga_{1-x7}P$, wherein $0<x7<1$; InGaAsP represents for $In_{x8}Ga_{1-x8}As_{1-y3}P_{y3}$, wherein $0<x8<1$ and $0<y3<1$; InGaAsN represents for $In_{x9}Ga_{1-x9}As_{1-y4}N_{y4}$, wherein $0<x9<1$ and $0<y4<1$; AlGaAsP represents for $Al_{x10}Ga_{1-x10}As_{1-y5}P_{y5}$, wherein $0<x10<1$ and $0<y5<1$; InGaAs represents for $In_{x11}Ga_{1-x11}As$, wherein $0<x11<1$; InGaN represents for $In_{x12}Ga_{(1-x12)}N$, wherein $0<x12<1$; AlGaInN represents for $(Al_{y6}Ga_{(1-y6)})_{1-x13}In_{x13}N$, wherein $0<x13<1$ and $0<y6<1$.

When the semiconductor device 100 is a light-emitting device, the semiconductor stack 1 can emit a light with a peak wavelength of about 200 nm~1800 nm. Specifically, the semiconductor stack 1 can emit an infrared light having a peak wavelength between 700 nm and 1600 nm, a red light having a peak wavelength between 610 nm and 650 nm, a yellow light having a peak wavelength between 550 nm and 570 nm, a blue or deep blue light having a peak wavelength between 400 nm and 490 nm, a green light having a peak wavelength between 490 nm and 550 nm, or a UV light having a peak wavelength between 400 nm and 250 nm.

As shown in FIGS. 1 and 2, the first contact structure 3 and the second contact structure 5 locate on the opposite sides of the semiconductor stack 1. The first contact structure 3 locates on a side near the first semiconductor structure 11, and the second contact structure 5 locates on a side near the second semiconductor structure 12. Each of the first contact structure 3 and the second contact structure 5 is a single layer or a multilayer. In the embodiment, the first contact structure 3 directly contacts the first semiconductor structure 11 and the second contact structure 5 directly contacts the second semiconductor structure 12.

The first contact structure 3 locates on the semiconductor stack 1 and provides a lower resistance path for current flowing therethrough. Moreover, the first contact structure 3 is not on a periphery region of the semiconductor stack 1 for avoiding a current from flowing through the periphery region so the non-radiative recombination effect at the periphery region can be reduced and the light-emitting efficiency of the semiconductor device 100 can be enhanced. Specifically, the first semiconductor structure 11 includes a first periphery P1 and the first contact structure 3 includes a second periphery P2 surrounded by the first periphery P1. The first semiconductor structure 11 includes a first side surface 111 and the first contact structure 3 includes a second side surface 31 spaced apart from the first side surface 111 by a first distance D1 of 2 μm~50 μm (such as, 10 μm, 20 μm, 30 μm, 40 μm).

As shown in FIGS. 1 and 2, the first contact structure 3 includes a plurality of contact parts 32 separated from one another to facilitate the current spreading ability thereof. Each of the contact part 32 includes a first contact portion 321 and a second contact portion 322 covering the first contact portion 321. Referring to FIG. 9C, in another embodiment, the first contact structure 3 forms a ring shape viewing from a top view of the semiconductor device 100. The first contact portion 321 includes semiconductor material, such as AlGaAs, GaAs or GaP, and the second contact portion 322 includes metal or metal alloy, such as Au, Ge, Be, GeAu, or BeAu. In some embodiments, the second contact portion 322 can be optionally omitted in order to decrease the absorption of light emitted by the semiconductor stack 1. When the second contact portion 322 is not formed, the first distance D1 is between the first side surface 111 and a side surface of the first contact portion 321. From the top view of the semiconductor device 100 shown in FIG. 1, the semiconductor stack 1 includes a first area, and the first contact structure 3 includes a second area smaller than the first area. A ratio of the second area to the first area is 0.01~0.85 (such as 0.1, 0.5, 0.75).

The second contact structure 5 locates between the conductive layer 2 and the semiconductor stack 1. More precisely, the second contact structure 5 directly contacts the second semiconductor structure 12 and the conductive layer 2. The second contact structure 5 includes a first part 511, a second part 512 and a third part 513. The second part 512 and the third part 513 extends from the first part 511 and laterally (X direction) beyond the first side surface 111. In other words, the first semiconductor structure 11 includes a first width W1 and the second contact structure 5 includes a second width W2 larger than the first width W1. The second contact structure 5 includes semiconductor material, such as AlGaAs, GaAs or GaP.

The first part 511 is covered by the semiconductor stack 1, the second part 512 is covered by the first electrode 61, and the third part 513 is exposed by the semiconductor stack 1 and the first electrode 61. In other words, the semiconductor stack 1 is merely on the first part 511 and is not on the second part 512 and the third part 513. The first electrode 61 is merely on the second part 512 and is not on the first part 511 and the third part 513.

The conductive layer 2 is below the second contact structure 5 and has a surface 21 facing the semiconductor stack 1. The surface 21 includes a first portion 211 and a second portion 212. The semiconductor stack 1 overlaps the first portion 211 in a vertical direction and the first electrode 61 overlap the second portion 212 in the vertical direction, and the semiconductor stack 1 is spaced apart from the first electrode 61. In other words, the semiconductor stack 1 is disposed on the first portion 211 without being on the second portion 212 and the first electrode 61 is disposed on the second portion 212 without being on the first portion 211. The conductive layer 2 has a third width W3 larger than the first width W1 of the first semiconductor structure 11. The third width W3 is substantially equal to the second width W2 of the second contact structure 5. In the present embodiment, the surface 21 directly contacts the second contact structure 5.

The conductive layer 2 can be transparent, semi-transparent or non-transparent. The conductive layer 2 has a resistivity lower than a resistivity of the second contact structure 5, thus the conductive layer 2 can facilitate to laterally spread the current. In order to spread efficiently, the resistivity of the conductive layer 2 is lower than $10^{-3}$ Ω-cm (such as $5 \times 10^{-5}$ Ω-cm or $5 \times 10^{-4}$ Ω-cm).

The conductive layer 2 includes conductive oxide, metal or metal alloy. In the embodiment, the conductive layer 2 is transparent for allowing the light emitted from the semiconductor stack 1 to penetrate therethrough. The conductive oxide includes zinc oxide (ZnO), indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), indium zinc oxide (IZO), tungsten doped indium oxide (IWO), gallium oxide ($Ga_2O_3$), lithium gallium oxide ($LiGaO_2$), lithium aluminum oxide ($LiAlO_2$), aluminum magnesium oxide ($MgAl_2O_4$) or the combination of the above material. The metal can be indium (In), or gold (Au). The metal alloy includes the metal mentioned above. In the embodiment, the conductive layer 2 is made of ITO, which has a lower resistivity than that of the second contact structure 5 made of GaP.

In the embodiment, the intermediate structure 4 locates on the first semiconductor structure 11 and encloses the first contact structure 3. The intermediate structure 4 is electrically connected to the first contact structure 3 and the second electrode 62. More specifically, the first contact structure 3 includes several surfaces, and at least two surfaces covered by the intermediate structure 4. In some embodiments, the semiconductor device 100 further includes a reflective layer 9 on the intermediate layer 4 and the intermediate layer 4 locates between the first contact structure 3 and the reflective layer 9.

When manufacturing the semiconductor device 100, an anneal process is usually applied in order to reduce the contact resistance between the first contact structure 3 and the semiconductor stack 1. The intermediate structure 4 can protect the reflective layer 9 from being contaminated by the elements or ions generated from the first contact structure 3 during the anneal process. Therefore, the reflectivity of the reflective layer 9 can be maintained after the anneal process. The intermediate structure 4 is conductive including an oxide material or a semiconductor material. The oxide material includes conductive oxide as aforesaid mentioned. The semiconductor material includes aluminum gallium arsenide (AlGaAs), gallium nitride (GaN) or gallium phosphide (GaP). In one embodiment, the intermediate structure 4 has a material the same as the conductive layer 2, for example, both of them are made of ITO or IZO.

The reflective layer 9 can reflect the light generated from the semiconductor stack 1 toward the conductive layer 2 for enhancing the light extraction efficiency of the semiconductor device 100. The reflective layer 9 has a reflectivity higher than 80% for the light emitted from the active structure 13. The reflective layer includes metal such as gold (Au), silver (Ag), copper (Cu), aluminum (Al), or the alloy thereof. In the embodiment, the reflective layer 9 covers the entire of a top surface of the intermediate structure 4. Furthermore, the reflective layer 9 covers the first contact structure 3. In other words, in a top view of the semiconductor device 100, the reflective layer 9 has an area larger than that of the first contact structure 3. The reflective layer 9 includes a fourth width W4 substantially the same as the first width W1 of the first semiconductor structure 11 in a cross-sectional view of the semiconductor device 100 and has an area substantially the same as that of the first semiconductor structure 11 in a top view of the semiconductor device 100.

The first electrode 61 directly contacts the second contact structure 5 and has a bottom surface 611 facing the conductive layer 2. The first electrode 61 is electrically connected to the semiconductor stack 1 through the second contact structure 5 and the conductive layer 2. The second electrode 62 is disposed on the intermediate layer 4, and the reflective layer 9 is between the second electrode 62 and the intermediate layer 4. The second electrode 62 covers the entire of a top surface of the reflective layer 9 and cover the first contact structure 3. The first electrode 61 and the second electrode 62 are located on the same side of the second contact structure 5 (or the conductive layer 2) which forms the semiconductor device 100 as a horizontal type device. In addition, the semiconductor device 100 can be flip-bonded to a carrier (not shown), such as PCB, transparent board with TFT switcher or flexible board by the first electrode 61 and the second electrode 62.

Since light generated from the active structure 13 is reflected by the reflective layer 9 toward the conductive layer 2 and the first contact structure 3 provides a current path to confine the current flowing through the central region of the semiconductor stack 1, the second electrode 62 can be designed to have an area as large as possible for enhancing the reliability when the semiconductor device 100 is bonded to the carrier. In one embodiment, an area of the second electrode 62 is 50~100% of the area of the reflective layer 9 (or the first semiconductor structure 11) in a top view.

The material of the first electrode 61 and the second electrode 62 can be metal, metal alloy or transparent conductive material. The metal includes aluminum (Al), chromium (Cr), copper (Cu), tin (Sn), gold (Au), nickel (Ni), titanium (Ti), platinum (Pt), plumbum (Pb), zinc (Zn), cadmium (Cd), antimony (Sb), or cobalt (Co). The metal alloy includes the metal mentioned above. The transparent conductive material includes ITO, InO, SnO, CTO, ATO, AZO, ZTO, GZO, IWO, ZnO, AlGaAs, GaN, GaP, GaAs, gallium arsenide phosphide (GaAsP), diamond-like carbon (DLC) or graphene.

The semiconductor device 100 includes optionally a bonding structure 81 below the conductive layer 2. The bonding structure 81 is transparent and includes a conductive material as aforesaid mentioned.

The semiconductor device 100 includes optionally a protective layer P covering the semiconductor stack 1. In the embodiment, the protective layer P covers the first electrode 61, the second electrode 62, the reflective layer 9, the intermediate structure 4, the semiconductor stack 1, the second contact structure 5 and the conductive layer 2. The protective layer P includes a first opening O1 exposing a part of the first electrode 61 and a second opening O2 exposing a part of the second electrode 62. The protective layer P can be used to protect the semiconductor stack 1 from damage by the outside contamination. The protective layer P is formed of a non-conductive material and includes organic material or inorganic material. The organic material includes Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone, glass, aluminum oxide ($Al_2O_3$), silicon nitride ($SiN_x$), silicon oxide ($SiO_x$), titanium oxide ($TiO_x$), or magnesium fluoride ($MgF_x$).

Figure 3:
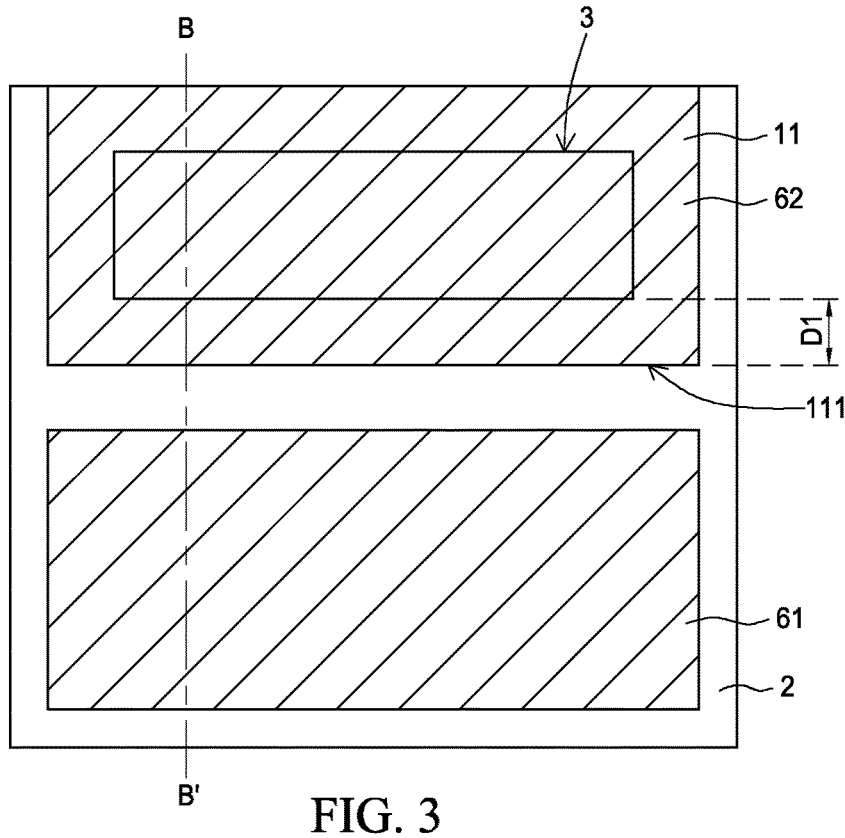
FIG. 3 shows a top view of a semiconductor device in accordance with one embodiment of the present application.
Figure 4:
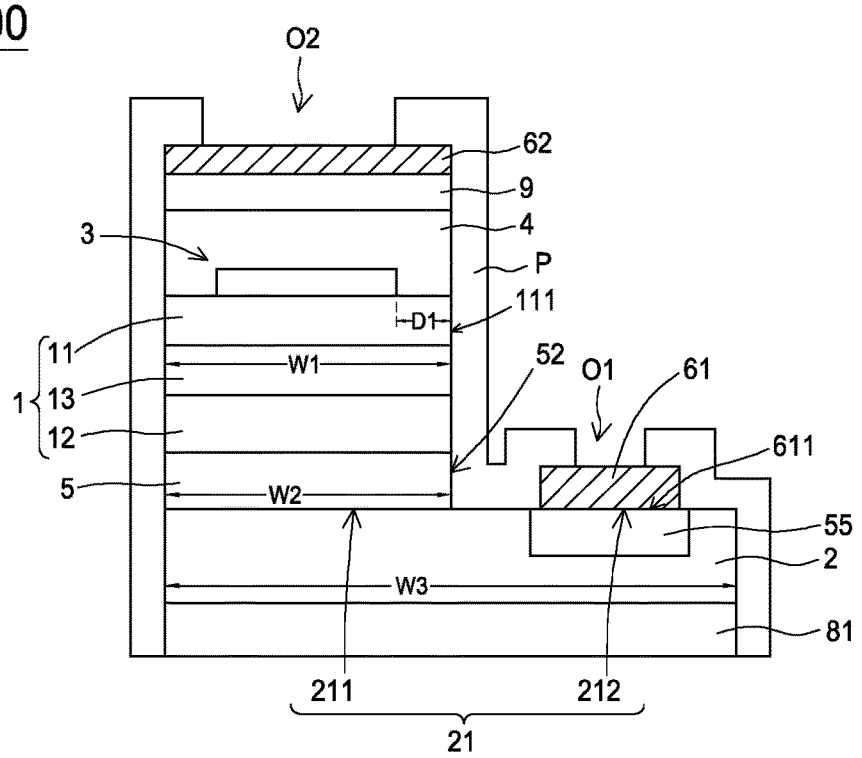
FIG. 4 shows a cross-sectional view of the semiconductor device shown in FIG. 3.

FIG. 3 shows a top view of a semiconductor device 200 in accordance with one embodiment of the present application. FIG. 4 is a cross-sectional view taken along line BB' of FIG. 3. The semiconductor device 200 has a similar structure to the semiconductor device 100.

In this embodiment, the second contact structure 5 is disposed on the first portion 211 and has the second width W2 smaller than the third width W3 of the conductive layer 2. In addition, the second width W2 is equal to the first width W1. The second contact structure 5 includes a third side surface 52 coplanar with the first side surface 111. The conductive layer 2 extends laterally beyond the third side surface 52.

The semiconductor device 200 includes optionally a metal structure 55 at the second portion 212 and between the first electrode 61 and the conductive layer 2. The metal structure 55 is spaced apart from the second contact structure 5. The metal structure 55 can include a single layer or a multilayer (Ti/Pt/Cr).

As shown in FIGS. 3~4, the semiconductor stack 1 includes the first area, and the first contact structure 3 includes a second area smaller than the first area in a top view of the semiconductor device 200. A ratio of the second area to the first area is 0.01~0.85 (such as 0.1, 0.5, 0.75). The second contact structure 5 directly contacts and covers the first portion 211 of the conductive layer 2. The second portion 212 of the conductive layer 2 is not covered by the second contact structure 5.

Figure 5:
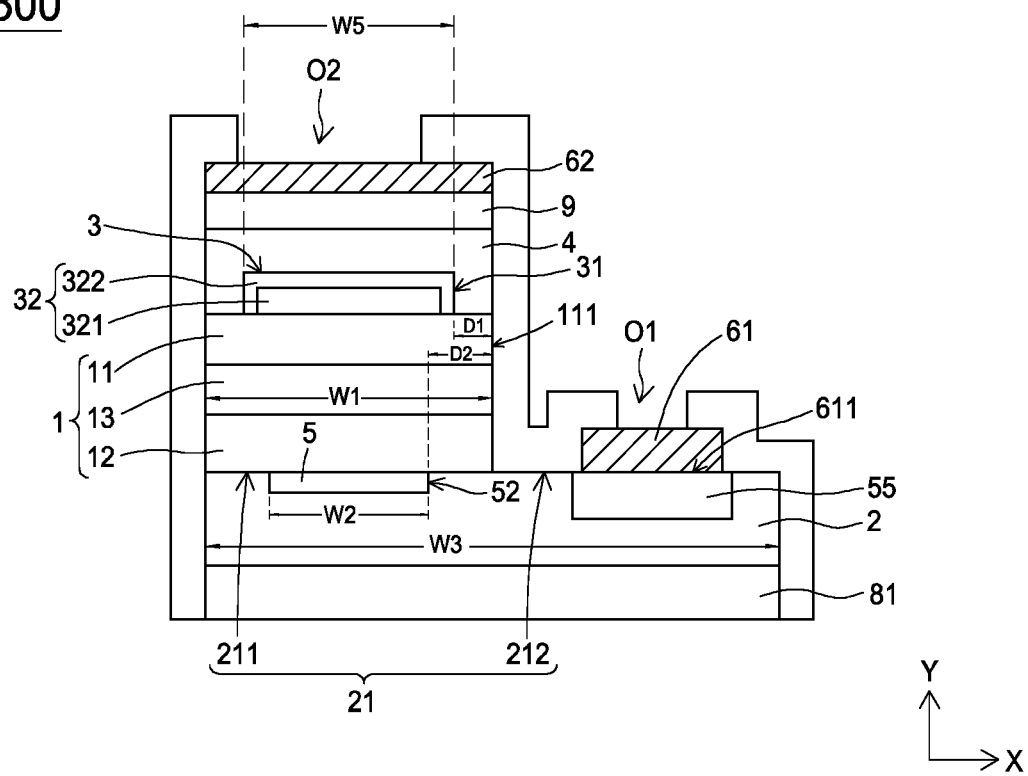
FIG. 5 shows a cross-sectional view of a semiconductor device in accordance with one embodiment of the present application.

FIG. 5 shows a cross-sectional view of a semiconductor device in accordance with one embodiment of the present application. The semiconductor device 300 has structure similar to the semiconductor device 200. In the embodiment, the second contact structure 5 is embedded in the conductive layer 2 and at a position corresponding to the first contact structure 3. More specifically, at least two surfaces of the second contact structure 5 are covered by the conductive layer 2. The second contact structure 5 has a third side surface 52 separated from the first side surface 111 by a second distance D2. In one embodiment, the second distance D2 is in a range of 2 μm~50 μm and can be 10 μm, 20 μm, 30 μm, 40 μm, or 50 μm. The second distance D2 can be the same as or larger than the first distance D1. In other words, the first contact structure 3 has a fifth width W5 is larger than or equal to the second width W2 of the second contact structure 5. In addition, the second width W2 is smaller than the first width W1. Because of the first contact structure 3 and the second contact structure 5, a current can be confined in the central region of the semiconductor stack 1 and prevented from flowing into the periphery region of the semiconductor stack 1 so the non-radiative recombination effect is reduced and the light-emitting efficiency can be further enhanced.

Figure 6:
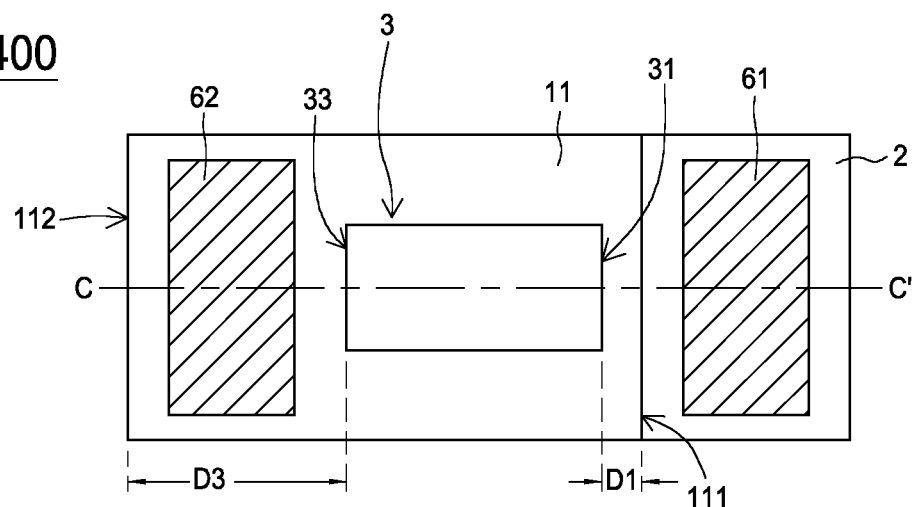
FIG. 6 shows a top view of a semiconductor device in accordance with one embodiment of the present application.
Figure 7:
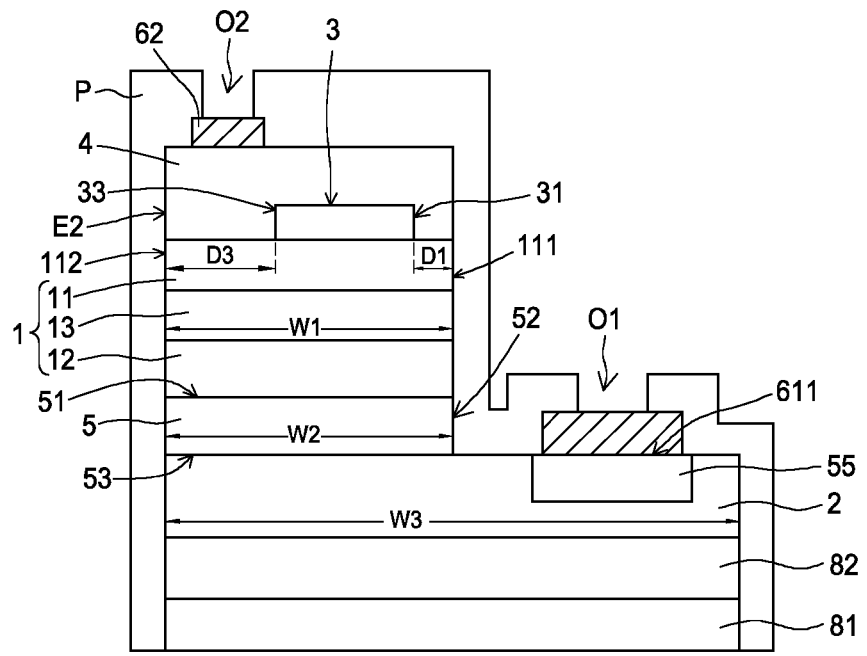
FIG. 7 shows a cross-sectional view of the semiconductor device in FIG. 6.

FIG. 6 shows a top view of a semiconductor device 400 in accordance with one embodiment of the present application. FIG. 7 is a cross-sectional view taken along line CC' of FIG. 6. The semiconductor device 400 has a structure similar to the semiconductor device 200.

In the embodiment, the semiconductor device 400 further includes a mirror structure 82 between the semiconductor stack 1 and the bonding structure 81 for reflecting light toward the second electrode 62. The mirror structure 82 includes copper (Cu), aluminum (Al), gold (Au), silver (Ag) or the alloy thereof.

The semiconductor devices shown in FIGS. 1-5 are bottom emitting type semiconductor devices, which means light emits out of the semiconductor device toward the side of the conductive layer 2 or the bonding structure 81. The semiconductor device 400 is a top emitting type semiconductor device, which means light emits out of the semiconductor device 400 toward the side opposite to the conductive layer 2, such as toward the second electrode 62. The reflective layer 9 shown in FIGS. 1~5 can be optionally omitted in the semiconductor device 400.

As shown in FIGS. 6 and 7, the first semiconductor structure 11 includes a first side surface 111 and a fourth side surface 112 opposite to the first side surface 111. Since the semiconductor device 400 is a top emitting type semiconductor device, in order to decrease the light blocked by the second electrode 62, the second electrode 62 is disposed closer to the fourth side surface 112 and the first contact structure 3 is closer to the first side surface 111. The second electrode 62 does not overlap the first contact structure 3 in the vertical direction (Y direction). In one embodiment, the second electrode 62 has a portion overlapping the first contact structure 3 in the vertical direction. From a top view of the semiconductor device 400, the second electrode 62 includes a third area and the first semiconductor structure 11 includes a first area, and a ratio of the third area to the first area is between 0.01 and 1 (such as, 0.04, 0.1, 0.3, or 0.5)

Furthermore, the first contact structure 3 includes a second side surface 31 and a fifth side surface 33 opposite to the second side surface 31. In the embodiment shown in FIG. 7, the second side surface 31 and the fifth side surface 33 are covered by the intermediate structure 4. A third distance D3 is defined as a distance between the fourth side surface 112 and the fifth side surface 33. The third distance D3 is in a range of 2 μm~50 μm. The third distance D3 is equal to or larger than the first distance D1.

Figure 8:
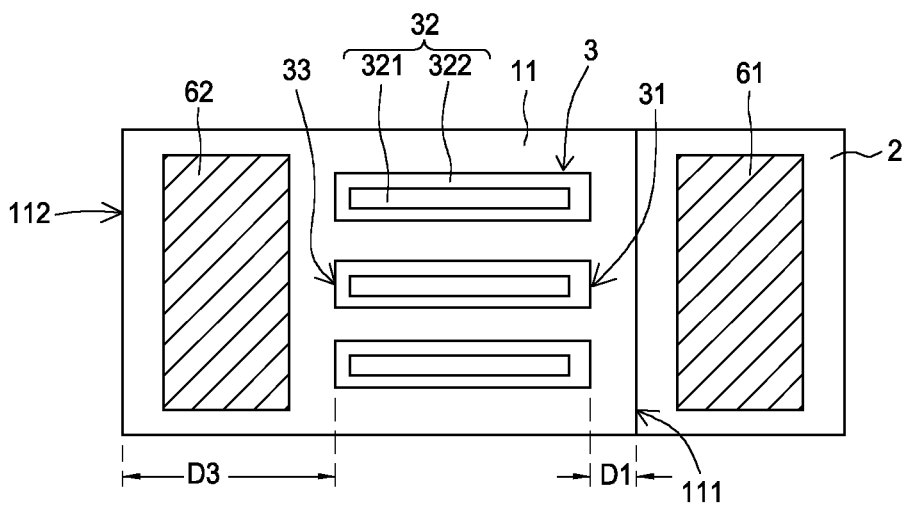
FIG. 8 shows a portion of a top view of the semiconductor device in accordance with one embodiment of the present application.

FIG. 8 shows a top view of the semiconductor device 500 in accordance with one embodiment of the present application. The semiconductor device 500 has a structure similar to the semiconductor device 400. In this embodiment, the semiconductor device 500 has the first contact structure 3 including a plurality of the contact parts 32 parallel with each other.

Figure 9A:
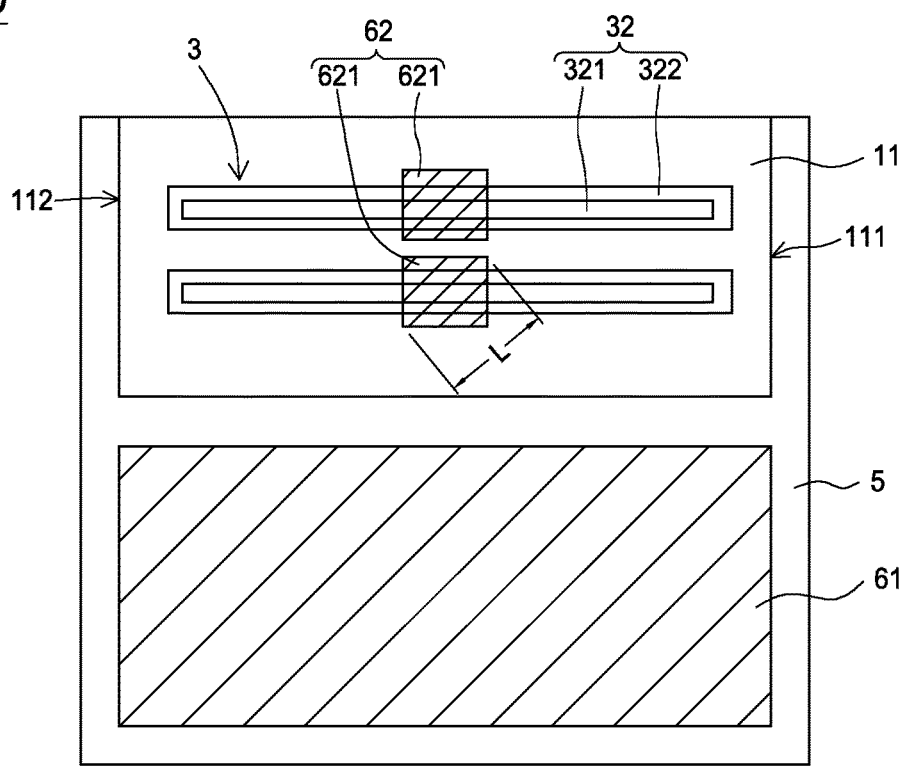
FIGS. 9A~9C show top views of the semiconductor device in accordance with embodiments of the present application.

FIG. 9A shows a top view of the semiconductor devices 600 in accordance with one embodiment of the present application. The semiconductor device 600 has a structure similar to the semiconductor device 100. In this embodiment, the second electrode 62 overlaps the first contact structure 3 and approximately locates on the central region of the semiconductor stack 1. More specifically, the second electrode 62 includes two electrode portions 621 separated from each other and the first contact structure 3 includes two contact parts 32. Each of the two electrode portions 621 is formed on each of the two contact parts 32. In the embodiment, the shape of the second electrode 62 is rectangle.

Figure 9B:
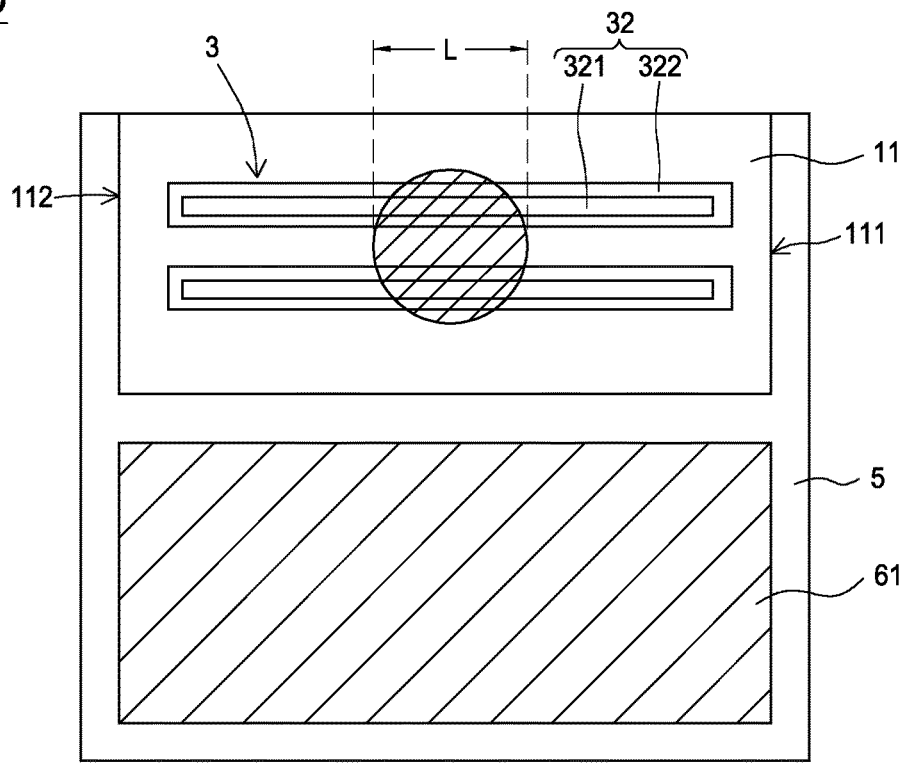
Figure 9C:
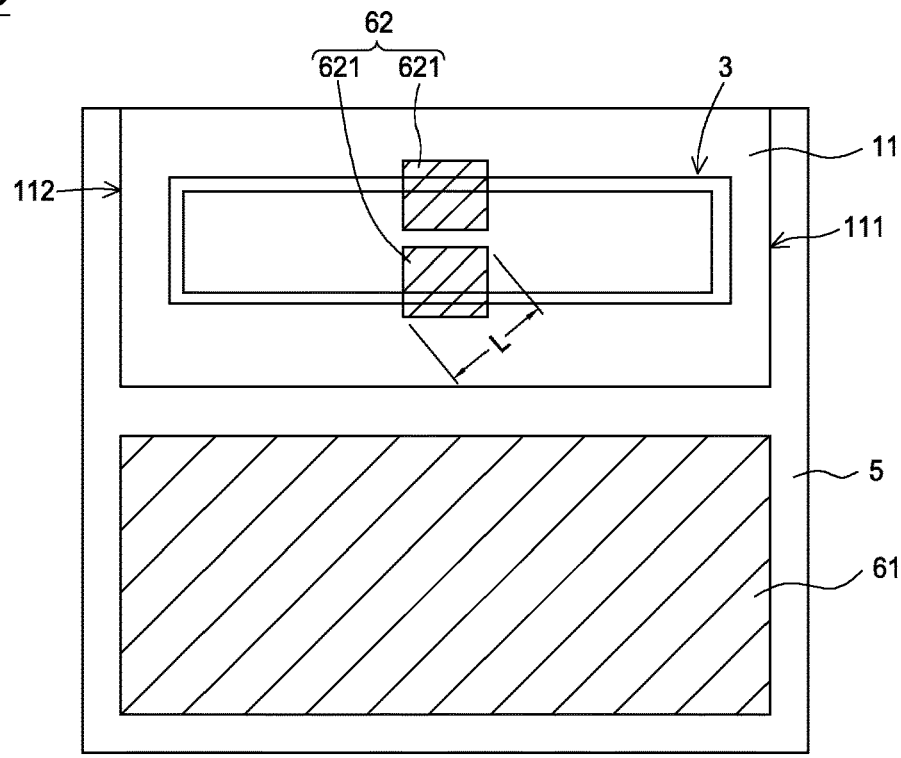

FIG. 9B shows a top view of the semiconductor devices 700 in accordance with one embodiment of the present application. The semiconductor device 700 has a structure similar to the semiconductor device 600. In this embodiment, a number of the second electrode 62 is one and the second electrode 62 is formed on and overlapped with the two contact parts 32. In a top view, the second electrode 62 includes a feature length L less than 30 μm and larger than 5 μm (such as 10 μm, 15 μm, 20 μm). The feature length L in the present embodiment refers to the longest distance between any two points on the periphery of the second electrode 62. For example, the feature length L of a circle refers to its diameter (shown in FIG. 9B) and the feature length L of a rectangle (shown in FIG. 9A) refers to its diagonal length. In the embodiments shown in FIGS. 9A~9B, a ratio of the third area of the second electrode 62 to the first area of the semiconductor structure 11 is between 0.01 and 1 (such as, 0.04, 0.1, 0.3, or 0.5). In one embodiment, the second electrode 62 can include transparent conductive material for passing light therethrough.

FIG. 9C shows a top view of the semiconductor devices 800 in accordance with one embodiment of the present application. The semiconductor device 800 has a structure similar to the semiconductor device 600. In this embodiment, the first contact structure 3 forms a ring shape.

Figure 10:
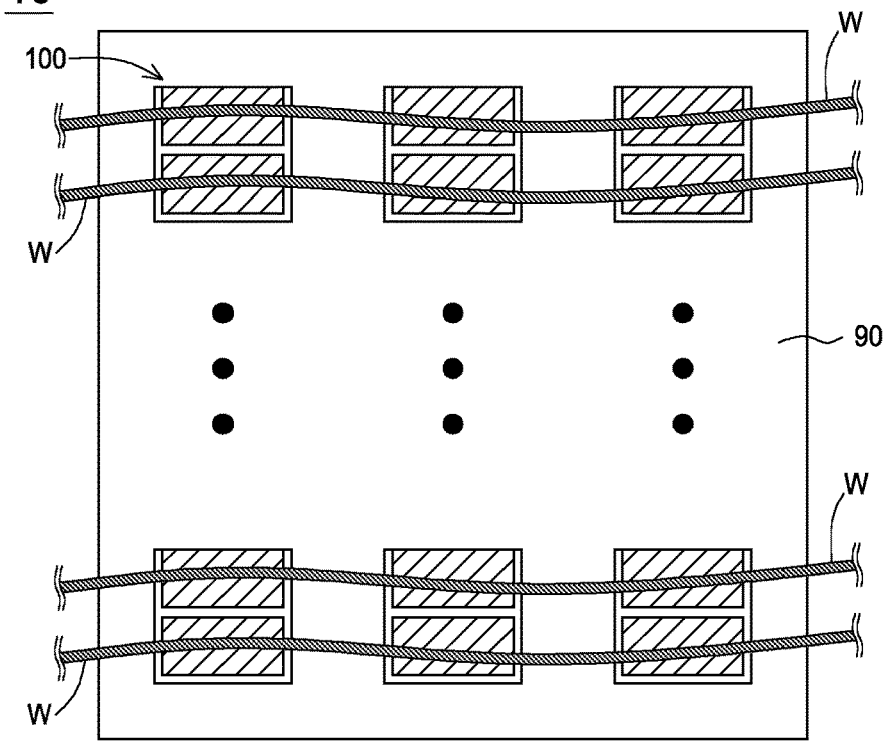
FIG. 10 shows a top view of a display apparatus in accordance with one embodiment of the present application.

FIG. 10 shows a top view of a display apparatus 10. The display apparatus 10 includes a carrier 90, and a plurality of semiconductor devices emitting different colors of light on the carrier 90. In this embodiment, some of the semiconductor devices in the display apparatus 10 emit red light, some emit green light, and others emit blue light. One or all of the semiconductor devices emitting red, green or blue light can include the semiconductor device in the embodiments mentioned above (the semiconductor device 100 is used as an example in FIG. 10). The display apparatus 10 further includes a plurality of wires W electrically connecting the semiconductor devices 100 with each other. In the embodiment, the semiconductor devices 100 are electrically connected with each other in parallel. The material of the wire W can be transparent conductive material to prevent the light emitting by the semiconductor stacks 1 (referring to FIG. 2) from being shielded by the wire W.

Figure 11A:
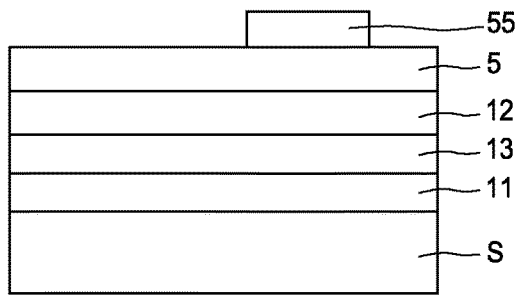
FIGS. 11A~11C show the processes of manufacturing the semiconductor device in accordance with one embodiment of the present application.
Figure 11B:
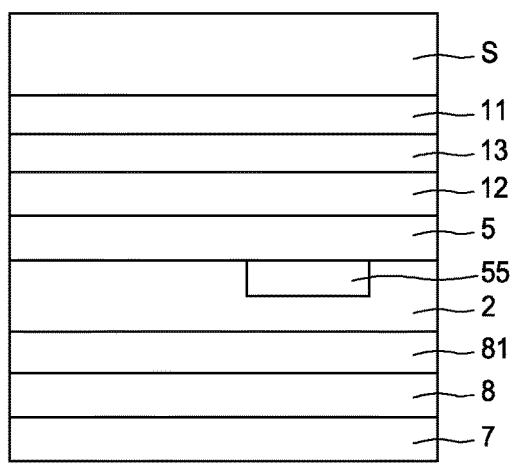
Figure 11C:
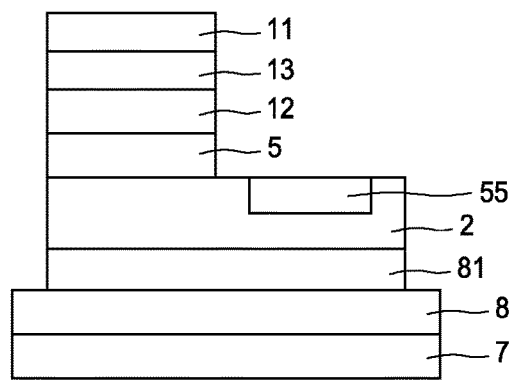

FIGS. 11A-11C show cross-sectional views of manufacturing the semiconductor device 200 of FIG. 4. Some components of the semiconductor device 200 are not shown in FIGS. 11A-11C.

As shown in FIG. 11A, a first semiconductor structure 11, an active structure 13, a second semiconductor structure 12, a second contact structure 5 and a metal structure 55 are sequentially disposed on a growth substrate S.

As shown in FIG. 11B, a conductive layer 2, a bonding structure 81, the sacrificial layer 8 and the substrate 7 are attached to the metal structure 55 and the second contact structure 5. After that, the growth substrate S is removed.

As shown in FIG. 11C, a removal step is performed to remove a part of the first semiconductor structure 11, the active structure 13, the second semiconductor structure 12, and the second contact structure 5 by wet etching or dry etching to expose the metal structure 55 and a portion of the conductive layer 2. The metal structure 55 can be used as an etching stop layer to avoid over-etching during the etching process. The metal structure 55 has a lower etching rate than that of the second contact layer 5 to an etchant used in the etching process.

Finally, referring to FIG. 4, the first contact structure 3, the intermediate structure 4, the reflective layer 9, the first electrode 61 and the second electrode 62 are formed. A part of the conductive layer 2 and a part of the bonding structure 81 can be optionally removed for facilitating subsequently transferring.

In one embodiment, the metal structure 55 is formed on the conductive layer after the step of FIG. 11C, thereby preventing a crack caused by the different coefficient of thermal expansion between the metal structure 55 and the conductive layer 2 during the step of FIG. 11B.

In an embodiment, after the semiconductor device 200 is transferred to or mounted on a carrier of an apparatus (such as display or wearable devices), the sacrificial layer 8 and the substrate 7 are removed to minimize the size thereof by dry etching, wet etching or laser lift-off (LLO). When the removing process is conducted by laser lift-off method, the substrate 7 is required to be transparent for the laser to penetrate therethrough to remove the sacrificial layer 8. The sacrificial layer 8 includes a semiconductor material. In the embodiment, the substrate 7 is sapphire and the sacrificial layer 8 is GaN or GaP.

Figure 12:
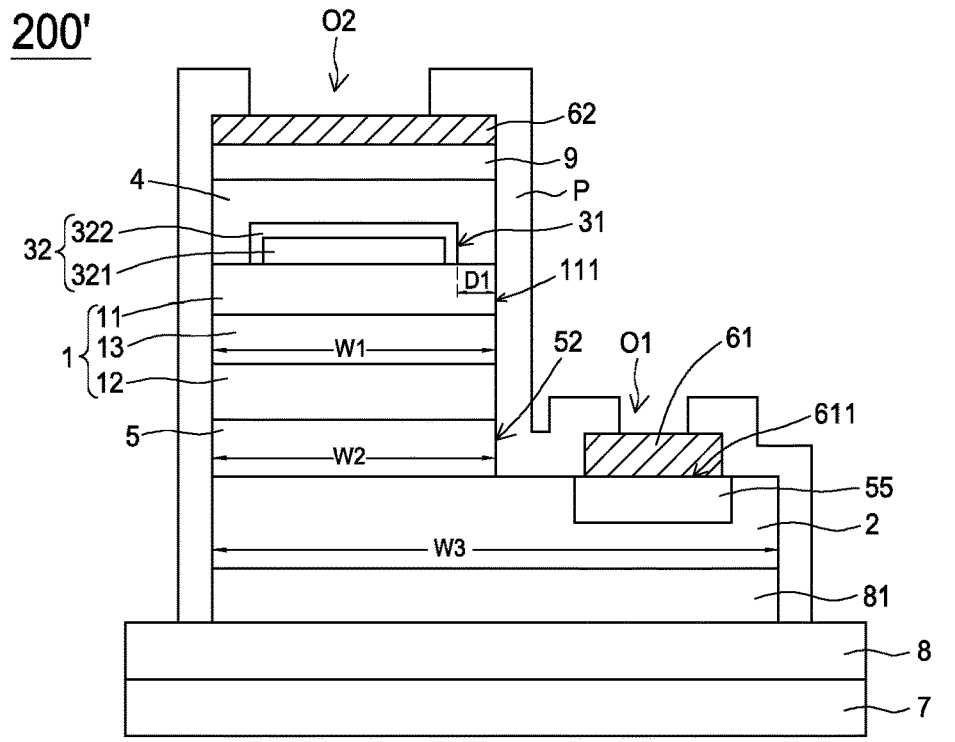
FIG. 12 shows a cross-sectional view of a semiconductor device in accordance with one embodiment of the present application

As shown in FIG. 12, the semiconductor device 200' is used as an intermediate product before being transferred to or mounted on a carrier. The substrate 7 and the sacrificial layer 8 remain for supporting and easily handling during transfer.

Figure 13:
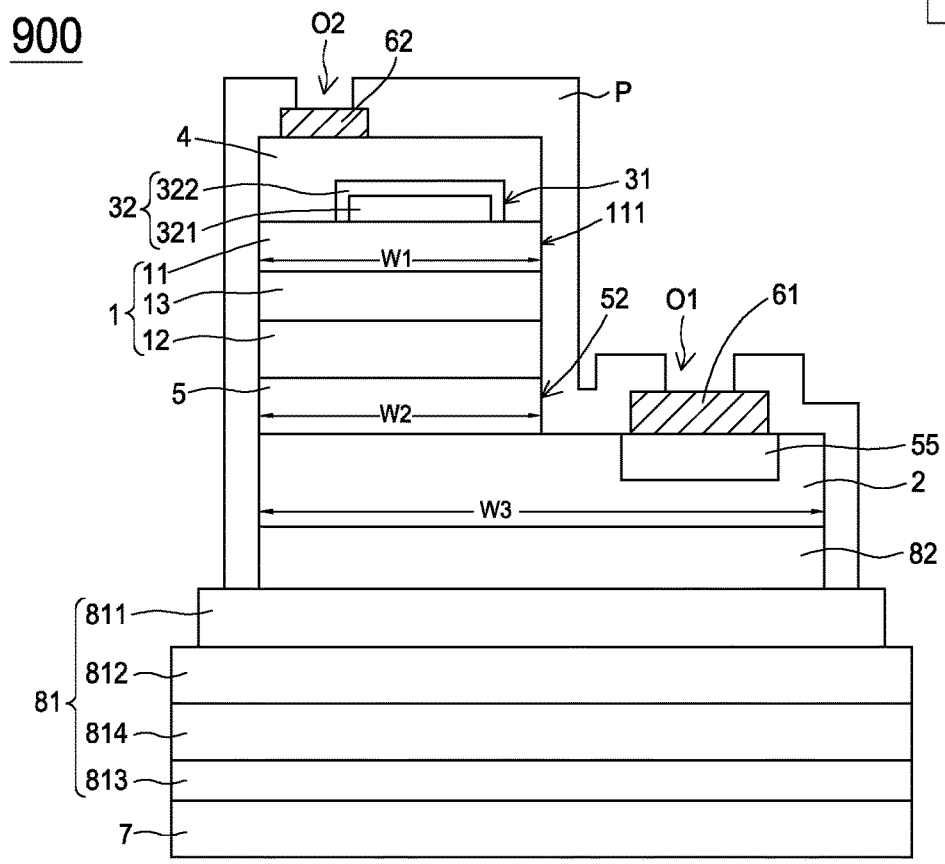
FIG. 13 shows a cross-sectional view of a semiconductor device in accordance with one embodiment of the present application.

FIG. 13 shows a cross-sectional view of a semiconductor device 900 in accordance with one embodiment of the present application. The semiconductor device 800 has a structure similar to the semiconductor device 400. In this embodiment, the bonding structure 81 further includes a bridge layer 811, a release layer 812 and an adhesive layer 813. The bridge layer 811 locates between the mirror structure 82 and the release layer 812 and is able to connect to a fixer (not shown) to anchor the semiconductor stack 1. Thus, the semiconductor stack 1 can be picked up by a force in the subsequent transfer process. The release layer 812 is used to be partially removed before the subsequent transfer process. More specifically, after removing a part of the release layer 812, the semiconductor stack 1 is dangled from the substrate 7 for facilitating the transfer process. The release layer 812 can be removed by dry etching using gas or wet etching. The adhesive layer 813 is used to adhere the substrate 7 to the bonding structure 81. The bonding structure 81 can further include a release stop layer 814 between the release layer 812 and the adhesive layer 813. The release stop layer 814 is provided to avoid over-etching so the substrate 7 and the adhesive layer 813 can be protected from being damaged during removal of the part of the release layer 812 and the transfer process. Thus, the substrate 7 can be reused after the transfer process. In the embodiment, the material of the release stop layer 814 includes metal (such as Ti) or oxide (such as $SiO_2$) and the thickness of the release stop layer 814 is 2k~5k Å.

The material of the bridge layer 811 includes oxide material or nitride material. The oxide material includes zinc oxide (ZnO), indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), indium zinc oxide (IZO), tungsten doped indium oxide (IWO), aluminum oxide ($Al_xO$) silicon oxide (SiOx), indium cerium oxide (ICO), indium titanium oxide (InTiO), indium gallium oxide (IGO), or gallium aluminum zinc oxide (GAZO). The nitride material includes silicon nitride (SiNx) or aluminum nitride (AlNx). The thickness of the bridge layer 811 is 5k Å~10k Å (such as 6k Å, 7k Å, 8k Å). In one embodiment, the bridge layer 811 is $SiO_2$.

The material of the release layer 812 is different from that of the semiconductor stack 1, the bridge layer 811, the adhesive layer 813, and the substrate 7 for preventing the semiconductor stack 1, the bridge layer 811, the adhesive layer 813 and the substrate 7 from being damaged during removal of the release layer 812. In one embodiment, the material of the release layer 812 can be silicon (Si) or zinc oxide (ZnO). The release layer 812 has a thickness of 1 μm~10 μm, such as 2 μm, 4 μm, 6 μm, or 8 μm.

The material of the adhesive layer 813 includes organic material or inorganic material. The organic material can be benzocyclobutene (BCB), cyclo olefin copolymer (COC), fluorocarbon polymer, Polyimide (PI) or perfluorocyclobutyl (PFCB). The inorganic material includes oxide material, nitride material, metal or metal alloy. The oxide material can be zinc oxide (ZnO), indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), indium zinc oxide (IZO), tungsten doped indium oxide (IWO), aluminum oxide ($Al_xO$) silicon oxide ($SiO_x$), indium cerium oxide (ICO), indium titanium oxide (InTiO), indium gallium oxide (IGO) or gallium aluminum zinc oxide (GAZO). The nitride material can be silicon nitride ($SiN_x$) or aluminum nitride ($AlN_x$). The metal can be indium (In), titanium (Ti), platinum (Pt), tungsten (W), copper (Cu), aluminum (Al), tin (Sn), gold (Au), silver (Ag), lead (Pb), or nickel (Ni). The metal alloy includes the metal mentioned above. In the embodiment, the adhesive layer 813 is a transparent structure including a single layer or a multilayer, and has a thickness between 1 μm and 10 μm. In the embodiment, the adhesive layer 813 includes $Al_2O_3$ layer and $SiO_2$ layer.

The bonding structure 81 of the semiconductor device 900 shown in FIG. 13 can be further referred to Taiwan patent application Serial No. 107130027.

Figure 14:
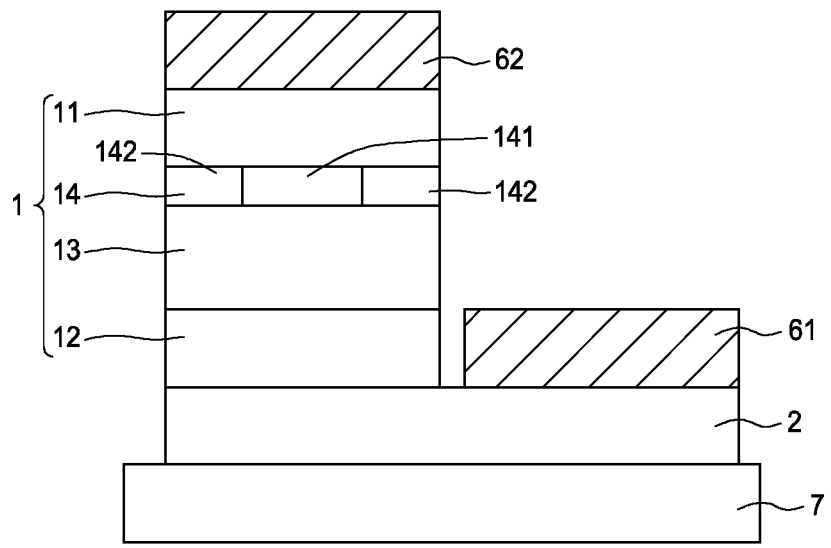
FIG. 14 shows a cross-sectional view of a semiconductor device in accordance with one embodiment of the present application.
Figure 15:
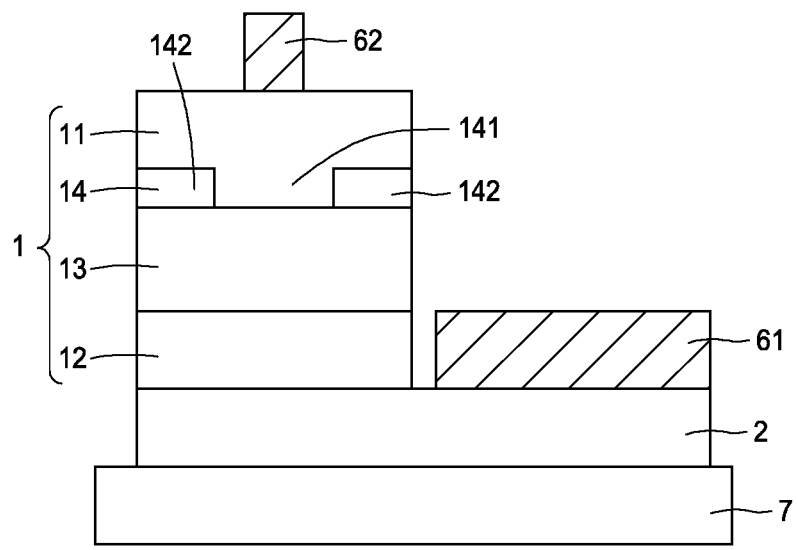
FIG. 15 shows a cross-sectional view of a semiconductor device in accordance with one embodiment of the present application.

FIG. 14 shows a cross-sectional view of a semiconductor device 1000 in accordance with embodiments of the present application. The semiconductor device 1000 is the bottom emitting type and the semiconductor device 1100 shown in FIG. 15 is the top emitting type. The related descriptions of the bottom emitting type and the top emitting type can be referred to the aforesaid paragraphs. The same name given or appeared in FIGS. 14 and 15 can be referred to the aforesaid paragraphs.

As shown in FIGS. 14~15, the semiconductor stack 1 of each of the semiconductor devices 1000, 1100 further includes a current confining structure 14. The current confining structure 14 includes a first region 141 and a second region 142 surrounding the first region 141. The first region 141 is located on the central region and the second region 142 is located on the periphery region. The conductivity of the first region 141 is higher than that of the second region 142 so the current can be confined in the first region 141 and prevented from flowing into the second region 142, thereby decreasing the non-radiative recombination effect. The second electrode 62 covers the entire of a top surface of the first semiconductor structure 11.

The current confining structure 14 can be disposed between the active structure 13 and the first semiconductor structure 11 as shown in FIGS. 14 and 15. In another embodiment, the current confining structure 14 can be located between the active structure 13 and the second semiconductor structure 12. The current confining structure 14 can be formed by oxidation or ion implantation.

As shown in FIG. 14, a structure is subjected to an oxidation process to change a portion thereof into oxide, and other portion remains un-oxidation and maintain the material same as that of the structure. The un-oxidation portion is as the first region 141 and the oxidation portion is as the second region 142. The first region 141 includes AlAs or AlGaAs, and the second region 143 includes $Al_2O_3$.

Alternatively, the current confining structure 14 can be formed by deposition and etching processes. As shown in FIG. 15, an insulating layer is formed on the active structure 13 and is subjected to an etching process to remove a central portion. Then, the first semiconductor structure 11 is formed on the insulating layer and fills in the central portion. The portion of the first semiconductor structure 11 filling into the central portion is used as the first region 141 and the un-removed insulating layer is used as the second portion 142. The insulating layer can be silicon oxide ($SiO_2$) or magnesium fluoride ($MgF_2$).

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments mentioned above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A semiconductor device comprising:
   a conductive layer;
   a semiconductor stack on the conductive layer comprising a first semiconductor structure with a first side surface;
   a first contact structure on the semiconductor stack and comprising a second side surface spaced apart from the first side surface by a first distance of 2 μm~50 μm;
   an intermediate structure enclosing the first contact structure;
   a second contact structure between the conductive layer and the semiconductor stack;
   a first electrode on the conductive layer and separated from the semiconductor stack; and
   a second electrode on the intermediate structure.

2. The semiconductor device of claim 1, further comprising a reflective layer between the intermediate structure and the second electrode.

3. The semiconductor device of claim 2, wherein the second electrode has an area of 50~100% of the area of the reflective layer in a top view of the semiconductor device.

4. The semiconductor device of claim 1, wherein the second contact structure has a third side surface separated from the first side surface by a second distance of 2 μm~50 μm.

5. The semiconductor device of claim 1, wherein the first contact structure comprises a plurality of contact parts separated from each other.

6. The semiconductor device of claim 1, wherein the semiconductor stack comprises a first semiconductor structure having a first width and the second contact structure comprises a second width larger than the first width from a cross-sectional view of the semiconductor device.

7. The semiconductor device of claim 6, wherein the conductive layer has a third width larger than first width.

8. The semiconductor device of claim 1, wherein the semiconductor stack comprises a first semiconductor structure having a first width and the second contact structure comprises a second width smaller than the first width from a cross-sectional view of the semiconductor device.

9. The semiconductor device of claim 1, wherein the second contact structure is embedded in the conductive layer.

10. The semiconductor device of claim 1, wherein the second electrode is not overlapped with the first contact structure in a vertical direction.

11. The semiconductor device of claim 10, wherein the first contact structure comprises semiconductor material, metal, or metal alloy.

12. The semiconductor device of claim 1, further comprising a bonding structure, wherein the conductive layer is between the second contact structure and the bonding structure.

13. The semiconductor device of claim 1, wherein the intermediate structure comprises a material the same as the conductive layer.

14. A display apparatus comprising:
 a carrier; and
 a plurality of semiconductor devices on the carrier, wherein one of which comprises the semiconductor device of claim 1.

15. The display apparatus of claim 14, wherein the plurality of semiconductor devices is electrically connected to each other in parallel.

16. A semiconductor device comprising:
 a conductive layer comprising conductive oxide, metal, or metal alloy;
 a semiconductor stack on the conductive layer;
 a first electrode on the conductive layer and separated from the semiconductor stack;
 a second electrode on the semiconductor stack; and
 a current confining structure between the conductive layer and the second electrode.

17. The semiconductor device of claim 16, wherein the semiconductor stack comprises a first semiconductor structure having a top surface with a top area and the second electrode covering 50~100% of the top area.

18. The semiconductor device of claim 16, wherein the current confining structure comprises a first region located on a central region of the semiconductor stack and a second region, and the first region has a conductivity higher than that of the second region.

19. A semiconductor device comprising:
 a conductive layer;
 a semiconductor stack on the conductive layer;
 a first contact structure on the semiconductor stack and comprising a plurality of contact parts separated from each other;
 an intermediate structure enclosing the first contact structure;
 a second contact structure between the conductive layer and the semiconductor stack;
 a first electrode on the conductive layer and separated from the semiconductor stack; and
 a second electrode on the intermediate structure.

20. The semiconductor device of claim 19, wherein the semiconductor stack can emit a light, and the light emits out of the semiconductor device toward the conductive layer.

* * * * *